(12) United States Patent
Chang et al.

(10) Patent No.: US 11,398,429 B2
(45) Date of Patent: Jul. 26, 2022

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Cheng Kai Chang, Taichung (TW); Chang-Fu Lin, Taichung (TW); Don-Son Jiang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 17/108,399

(22) Filed: Dec. 1, 2020

(65) Prior Publication Data

US 2022/0093518 A1 Mar. 24, 2022

(30) Foreign Application Priority Data

Sep. 24, 2020 (TW) .................................. 109133123

(51) Int. Cl.
| | | |
|---|---|---|
| *H01L 23/538* | (2006.01) | |
| *H01L 21/56* | (2006.01) | |
| *H01L 25/00* | (2006.01) | |
| *H01L 25/065* | (2006.01) | |

(52) U.S. Cl.
CPC .......... *H01L 23/5384* (2013.01); *H01L 21/56* (2013.01); *H01L 23/5385* (2013.01); *H01L 23/5386* (2013.01); *H01L 25/0657* (2013.01); *H01L 25/50* (2013.01)

(58) Field of Classification Search
CPC .................................................... H01L 23/5384
See application file for complete search history.

(56) References Cited

U.S. PATENT DOCUMENTS

| | | | | |
|---|---|---|---|---|
| 10,741,500 | B2 * | 8/2020 | Huang | .................. H01L 21/561 |
| 11,152,331 | B2 * | 10/2021 | Wang | .................. H01L 23/3121 |
| 2018/0269181 | A1 * | 9/2018 | Yang | ..................... H01L 21/561 |
| 2020/0411458 | A1 * | 12/2020 | Kim | ..................... H01L 25/0655 |
| 2021/0028098 | A1 * | 1/2021 | Yoo | ..................... H01L 23/3128 |
| 2021/0035878 | A1 * | 2/2021 | Jin | ....................... H01L 23/5226 |
| 2021/0118806 | A1 * | 4/2021 | Tai | ......................... H01L 25/16 |
| 2021/0296246 | A1 * | 9/2021 | Lane | ........................ H01L 25/50 |
| 2022/0148952 | A1 * | 5/2022 | Patil | ................... H01L 23/49861 |
| 2022/0149005 | A1 * | 5/2022 | Sun | .......................... H01L 23/31 |

\* cited by examiner

*Primary Examiner* — Thao P Le (74) *Attorney, Agent, or Firm* — Kelly & Kelley, LLP (57) ABSTRACT

An electronic package is provided, which is disposed with a second electronic component and a third electronic component on a first electronic component as a carrier structure, such that there is no need to match a layout size of the conventional package substrate. Therefore, the first electronic component can be designed as a System on a Chip (SoC) with a smaller size to improve the process yield.

20 Claims, 5 Drawing Sheets

ELECTRONIC PACKAGE AND MANUFACTURING METHOD THEREOF

BACKGROUND

1. Technical Field

The present disclosure relates to a semiconductor chip packaging technique, and more particularly, to an electronic package that improves yield and a manufacturing method thereof.

2. Description of Related Art

The rapid development of electronic industry has brought about electronic products with multiple functions and high performance Existing techniques used in the field of chip packaging include, flip-chip packaging modules, such as chip scale package (CSP), direct chip attached (DCA) and multi-chip module (MCM), chip stacking techniques involving stacking chips into three-dimensional (3D) integrated circuits (ICs), or the like.

Figure 1:
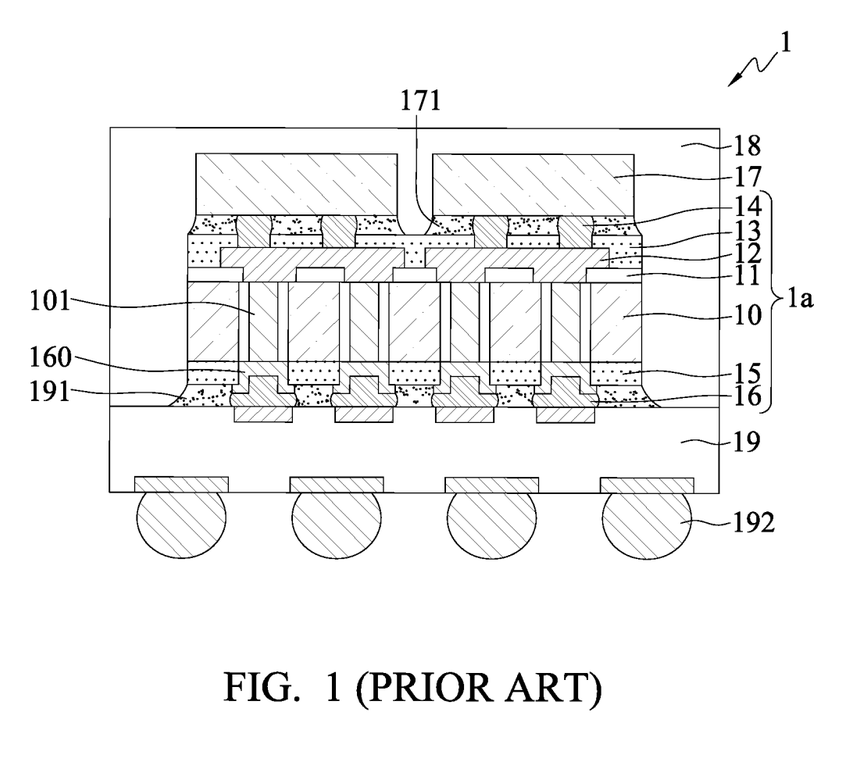
FIG. 1 is a schematic cross-sectional view of a conventional package structure.

FIG. 1 is a schematic cross-sectional view of a package structure 1 of a conventional 3D stacked IC. As shown in FIG. 1, the package structure 1 includes a through silicon interposer (TSI) 1a having a silicon board 10 and a plurality of through-silicon vias (TSVs) 101 formed therein. A redistribution layer (RDL) is formed on the surface of the silicon board 10 and electrically connected with the TSVs 101. More specifically, the RDL includes a dielectric layer 11 and a circuit layer 12 formed on the dielectric layer 11. The circuit layer 12 is electrically connected with the TSVs 101, and an insulating protective layer 13 is formed on the dielectric layer 11 and the circuit layer 12. Portions of the circuit layer 12 are exposed from the insulating protective layer 13 to be bonded with a plurality of first conductive elements 14 (e.g., solder bumps).

Moreover, another insulating protective layer 15 can first be formed on the silicon board 10, and ends of the TSVs 101 are exposed from the insulating protective layer 15 for bonding with a plurality of second conductive elements 16. The second conductive elements 16 are electrically connected with the TSVs 101, wherein the second conductive elements 16 contain a solder material or copper (Cu) bumps. An under bump metallurgy (UBM) 160 can be optionally formed on the ends of the TSVs 101 for connecting with the second conductive elements 16.

In addition, the package structure 1 further includes a package substrate 19 on which the TSI 1a can be disposed via the second conductive elements 16, wherein the package substrate 19 is electrically connected with the TSVs 101, and the second conductive elements 16 are covered by an underfill 191.

Furthermore, the package structure 1 further includes a plurality of semiconductor chips 17 disposed on the first conductive elements 14, such that the semiconductor chips 17 are electrically connected to the circuit layer 12, wherein the semiconductor chips 17 are bonded to the first conductive elements 14 by the flip-chip technique, and the first conductive elements 14 are covered by an underfill 171. An encapsulant 18 is formed on the package substrate 19 for encapsulating the semiconductor chips 17 and the TSI 1a.

In subsequent applications, a plurality of solder balls 192 may be formed on the lower side of the package substrate 19, such that the package structure 1 can be connected to an electronic device (not shown), such as a circuit board.

However, with demands for more electrical functions in the end products, more and more electronic components (e.g., the semiconductor chips 17) are disposed on the TSI 1a. This forces the TSI 1a to have a larger bonding area, and the number of the TSVs 101 to be laid out also increases. Nonetheless, it can be a challenge in the manufacturing process to manufacture a large number of TSVs 101. This results in a decrease in the yield of the package structure 1.

In addition, if a semiconductor component (e.g., a System on a Chip [SoC]) is disposed on the package substrate 19 in replacement of the TSI 1a, then the semiconductor component needs to be design as a large-sized SoC so as to be compatible with the layout size of the package substrate 19. As a result, a photomask with a scale factor greater than one (1× reticle) is needed for manufacturing, resulting in a decrease in the wafer yield (e.g., 20~30%). Moreover, in order to meet the need for stable power supply, a greater number of passive components (e.g., variable resistors) has to be provided on the package substrate 19, which increases the area of the package substrate 19. Thus, the need of miniaturization cannot be met.

Therefore, there is a need for a solution that addresses the aforementioned issues in the prior art.

SUMMARY

In view of the aforementioned shortcomings of the prior art, the present disclosure provides an electronic package, which may include: a first electronic component having an active face and electrode pads disposed on the active face; a second electronic component provided on the active face of the first electronic component and having a first side and a second side opposite to each other and a plurality of conductive vias interconnecting the first side and the second side, wherein the second electronic component is connected to the active face via the first side, and the plurality of conductive vias are electrically connected with the electrode pads; and a third electronic component provided on the active face of the first electronic component and electrically connected to the electrode pads.

The present disclosure also provides a manufacturing method of an electronic package, which may include: providing a first electronic component having an active face and electrode pads disposed on the active face; providing a second electronic component on the active face of the first electronic component, wherein the second electronic component has a first side and a second side opposite to each other and a plurality of conductive vias interconnecting the first side and the second side, such that the second electronic component is connected to the active face via the first side, and the plurality of conductive vias are electrically connected with the electrode pads; and providing a third electronic component on the active face of the first electronic component and electrically connected to the electrode pads.

In the aforementioned electronic package and the manufacturing method thereof, the first electronic component is connected to the second electronic component and the third electronic component via conductors.

In the aforementioned electronic package and the manufacturing method thereof, a plurality of the third electronic components are stacked on top of another one on the active face of the first electronic component.

In the aforementioned electronic package and the manufacturing method thereof, a plurality of another conductive vias are formed inside the third electronic component.

In the aforementioned electronic package and the manufacturing method thereof, the first electronic component is an active component.

In the aforementioned electronic package and the manufacturing method thereof, at least one of the second electronic component and the third electronic component is a passive component.

The aforementioned electronic package and the manufacturing method thereof may further include a circuit structure formed on the second side of the second electronic component. For example, the circuit structure is further formed on the third electronic component. Furthermore, the aforementioned electronic package and the manufacturing method thereof may further include a plurality of conductive components formed on the circuit structure.

The aforementioned electronic package and the manufacturing method thereof may further include an encapsulating layer formed on the active face for encapsulating the second electronic component and the third electronic component.

As can be understood from the above, in the electronic package and the manufacturing method of the present disclosure, by using the first electronic component as the carrier structure on which semiconducting passive components with fine lines and fine pitches (e.g., the second electronic component or the third electronic component) can be disposed, there is no need to match the layout size of a conventional package substrate, so that the first electronic component can be designed as a SoC with a smaller size, thereby improving the product yield.

Moreover, with the design of the conductors of the first electronic component, after the semiconducting passive components are connected, power supply stability can be improved, while high power can be provided, and better copper migration can be generated under high current.

In addition, passive components required can be provided on the first electronic component depending on the needs, so that the number of conductive vias to be laid out can be designed according to the needs. Also, the number of conductive vias in a single passive component can be significantly reduced, thereby facilitating the manufacturing process of the conductive vias and improving the yield of the electronic package.

Moreover, the first electronic component is used as the carrier structure on which the required semiconducting passive components can be stacked, so that there is no need to use a conventional package substrate. Thus, compared to the prior art, the electronic package of the present disclosure can be provided for miniaturized and thin designs.

DETAILED DESCRIPTION

The implementations of present disclosure are illustrated using the following specific embodiments. One of ordinary skill in the art can readily appreciate other advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and the objectives achieved by the present disclosure, any modifications, changes or adjustments to the structures, ratio relationships or sizes, are to be construed as falling within the range covered by the technical contents disclosed herein. Meanwhile, terms such as "above," "first," "second," "a," "an," and the like, are for illustrative purposes, and are not meant to limit the scope in which the present disclosure can be implemented. Any variations or modifications made to their relative relationships, without changing the substantial technical content, are also to be considered as within the scope in which the present disclosure can be implemented.

FIGS. 2A to 2D are schematic cross-sectional views illustrating a manufacturing method of an electronic package 2 in accordance with a first embodiment of the present disclosure.

Figure 2A:
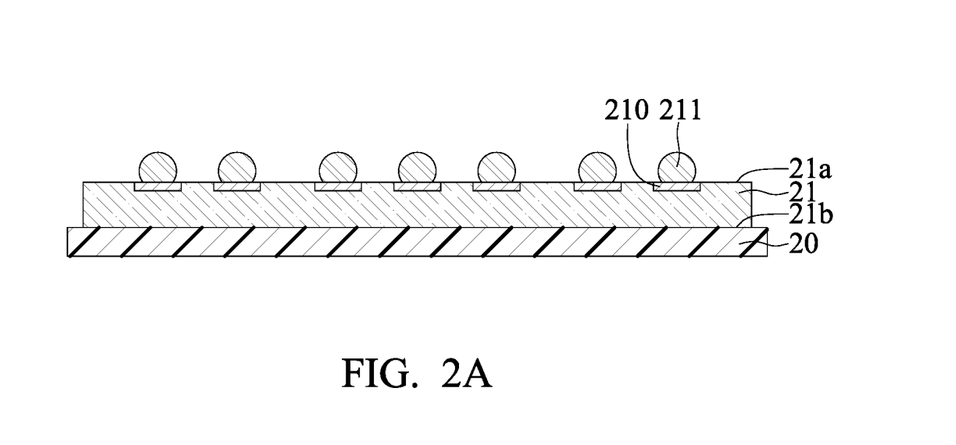
FIGS. 2A to 2D are schematic cross-sectional views illustrating a manufacturing method of an electronic package in accordance with a first embodiment of the present disclosure.

As shown in FIG. 2A, a first electronic component 21 is provided on a supporting board 20, so that the first electronic component 21 can be used as a carrier structure of the electronic package 2.

In an embodiment, the first electronic component 21 is an active component made of a semiconductor material, such as a System on a Chip (SoC), wherein a plurality of electrode pads 210 are provided on an active face 21a of the first electronic component 21, and a plurality of conductors 211 (e.g., electrical conductors) are formed on the electrode pads 210. For example, the conductors 211 are bump-shaped, which include metal (e.g., a solder material or copper) pillars or other suitable structures, or insulators with metal claddings, or solder balls (e.g., copper core balls), and the present disclosure is not limited as such.

Moreover, an insulating material (not shown) can be optionally formed on the active face 21a of the first electronic component 21 for covering the conductors 211, which can be a non-conductive film (NCF), such as anisotropic conductive paste (ACP), anisotropic conductive film (ACF), or other structures.

Moreover, the supporting board 20 can be a circular board that is made of, for example, a semiconductor material (e.g., silicon or glass) and formed as a wafer-form substrate or a panel-form substrate depending on the needs. The supporting board 20 can be optionally sequentially coated with a release layer (not shown) and with an adhesive layer (not shown) to allow the first electronic component 21 to be provided on the adhesive layer via the non-active face 21b opposite to the active face 21a.

Figure 2B:
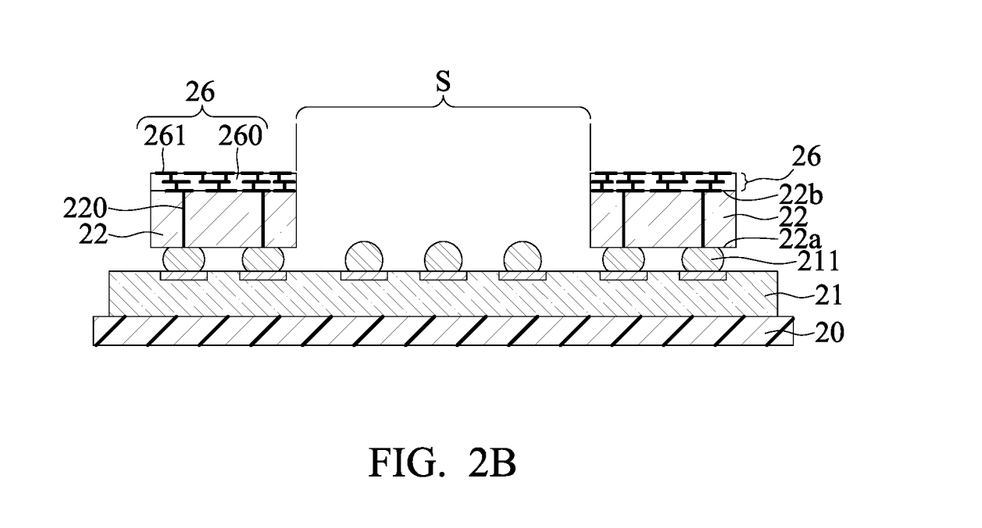

As shown in FIG. 2B, at least one second electronic component 22 is provided on the active face 21a of the first electronic component 21. The second electronic component 22 has a first side 22a and a second side 22b opposite to each other. The second electronic component 22 is electrically connected with the first electronic component 21 through the conductors 211 or pads direct bonding (such as pad-to-pad direct bonding or dielectric-to-dielectric direct bonding) via the first side 22a. A circuit structure 26 electrically connected with the second electronic component 22 is formed on the second side 22b of the second electronic component 22.

In an embodiment, the second electronic component 22 is a passive component made of a semiconductor material, such as a variable resistor (VR), flash memory, or dynamic random-access memory (DRAM). At least one conductive via 220, such as a through-silicon via (TSV), is formed in the second electronic component 22 interconnecting the first side 22a and the second side 22b and electrically connected with the circuit structure 26. It can be appreciated that there are numerous configurations of the conductive via 220, such as one with a pad on the end of the conductive via 220, and the present disclosure is not limited as such.

Furthermore, the circuit structure 26 includes at least one insulating layer 260 and a redistribution layer (RDL) 261 provided in the insulating layer 260. The outermost insulating layer 260 can be used as a solder resist layer, and the outermost RDL 261 is exposed from the solder resist layer. Alternatively, the circuit structure 26 can also include a single insulating layer 260 and a single RDL 261. For example, the RDL 261 can be made of copper, and the insulating layer 260 can be made of a dielectric material, such as, for example, polybenzoxazole (PBO), polyimide (PI), a prepreg (PP), etc.

In addition, the circuit structure 26 is in contact with the second side 22b of the second electronic component 22 via the insulating layer 260, and the RDL 261 of the circuit structure 26 is electrically connected with the conductive via 220 of the second electronic component 22.

Moreover, a plurality of second electronic components 22 are provided on the active face 21a of the first electronic component 21 at intervals, such that at least one accommodating space S is formed between two adjacent second electronic components 22.

Figure 2C:
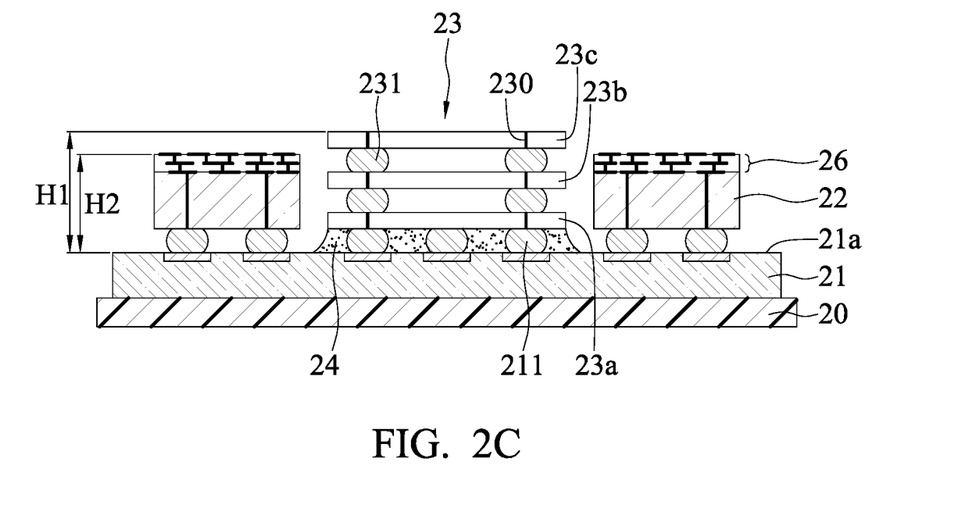

As shown in FIG. 2C, at least one third electronic component 23a is provided on the active face 21a of the first electronic component 21 in the accommodating space S, such that the third electronic component 23a is electrically connected with the first electronic component 21 via the conductors 211.

In an embodiment, the third electronic component 23a is a passive component made of a semiconductor material, such as an integrated passive device (IPD), or memory, such as a flash memory or DRAM. For example, a plurality of third electronic components 23a, 23b, 23c can be electrically stacked together to form an electronic assembly 23 according to the needs, wherein the height H1 of the electronic assembly 23 with respect to the active face 21a can be adjusted according to needs, for example, the height H1 can be adjusted to be higher than (or lower than or equal to) the total height H2 of the second electronic component 22 and the circuit structure 26 with respect to the active face 21a.

Furthermore, at least one conductive via 230, such as a through-silicon via (TSV), can be provided in each of the third electronic components 23a, 23b, 23c for electrically connecting the conductors 211 with each of the third electronic components 23a, 23b, 23c. For example, the third electronic components 23a, 23b, 23c can be electrically connected with one another through conductors 231. The conductors 231 are bump-shaped, which include metal (e.g., a solder material or copper) pillars or other suitable structures, or insulators with metal claddings, or solder balls (e.g., copper core balls), and the present disclosure is not limited as such.

In addition, an encapsulating layer 24, such as an underfill, can be optionally formed between the active face 21a of the first electronic component 21 and the first side 22a of the second electronic component 22 and/or the third electronic component 23a.

Figure 2D:
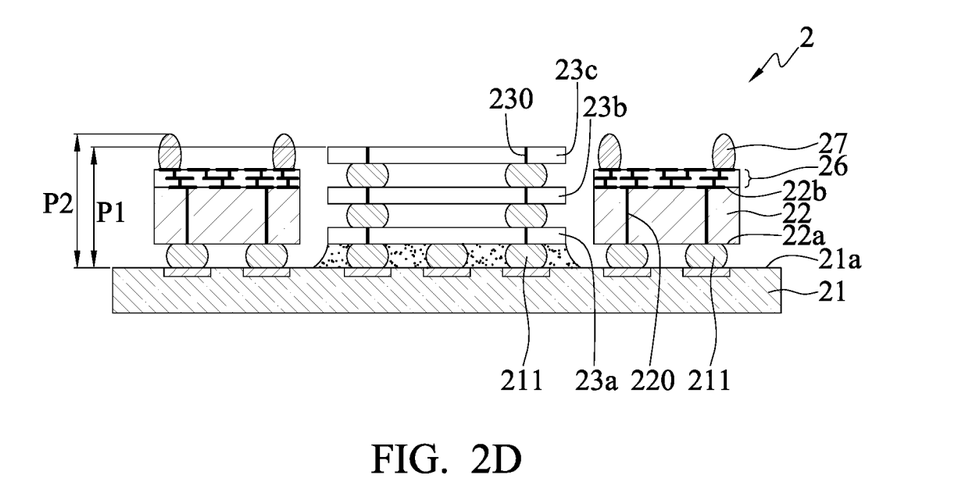

As shown in FIG. 2D, the supporting board 20 is removed, and a plurality of conductive components 27 (e.g., electrically conductive components) are formed on the circuit structure 26, and the conductive components 27 are electrically connected with the RDL 261 so as to allow the electronic package 2 to be connected externally to an electronic device (not shown), such as a circuit board, via the conductive components 27.

In an embodiment, the conductive components 27 are bumps or balls, and include metal (e.g., a solder material or copper) pillars or other suitable structures, or insulators with metal claddings, or solder balls (e.g., copper core balls), and the present disclosure is not limited as such. While the conductor can be copper core ball connected to a circuit board, better copper migration can be generated under high current.

Furthermore, the height P2 of the conductive components 27 with respect to the active face 21a of the first electronic component 21 is higher than the height P1 of the electronic assembly 23 with respect to the active face 21a of the first electronic component 21 to facilitate the connection of the conductive components 27 with an external electronic device.

Therefore, in the manufacturing method of the present disclosure, the first electronic component 21 is used as the carrier structure, and passive components made of semiconductor material or memory with fine lines and fine pitches (e.g., the second electronic components 22 or the third electronic components 23a, 23b, 23c) can be disposed thereon. As a result, there is no need to dispose the memory in the first electronic component 21, and the first electronic component 21 can be designed as a SoC with a smaller size, thereby improving the product yield.

Moreover, with the design of the conductors 211 of the first electronic component 21, after the passive components made of semiconductor material (e.g., the second electronic component 22 or the third electronic components 23a, 23b, 23c) are connected, power supply stability can be improved, and high power can be provided.

In addition, passive components required (e.g., the second electronic components 22 or the third electronic components 23a, 23b, 23c) can be provided on the first electronic component 21 depending on the needs, so that the number of conductive vias 220, 230 to be laid out can be designed according to the needs. Also, the number of conductive vias 220, 230 in a single passive component can be significantly reduced, thereby facilitating the manufacturing process of the conductive vias 220, 230 and improving the yield of the electronic package 2.

Moreover, the first electronic component 21 is used as the carrier structure on which the required passive components made of semiconductor material (e.g., the second electronic components 22 or the third electronic components 23a, 23b, 23c) can be stacked, so there is no need to use a conventional package substrate. Thus, compared to the prior art, the electronic package 2 of the present disclosure is advantageous to miniaturized and thin designs.

FIGS. 3A to 3D are schematic cross-sectional views illustrating a manufacturing method of an electronic package 3 in accordance with a second embodiment of the present disclosure. This embodiment is different from the first embodiment in the manufacturing step of the circuit structure, and the remainder of the manufacturing method is more or less the same, and will not be repeated in the following descriptions.

Figure 3A:
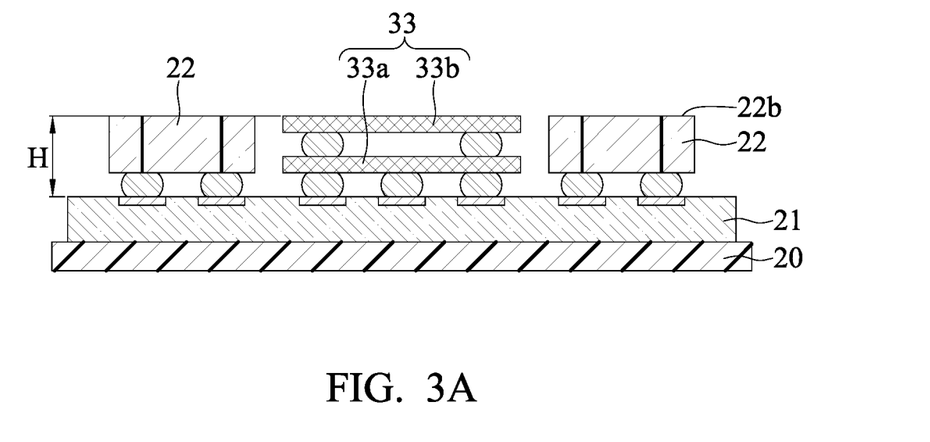
FIGS. 3A to 3D are schematic cross-sectional views illustrating a manufacturing method of an electronic package in accordance with a second embodiment of the present disclosure.

As shown in FIG. 3A, subsequent to the step shown in FIG. 2A, at least one second electronic component 22 and a plurality of third electronic components 33a, 33b are disposed on the active face 21a of the first electronic component 21.

In an embodiment, no circuit structure is formed on the second side 22b of the second electronic component 22, and the plurality of third electronic components 33a, 33b are the passive components made of semiconductor material without any conductive vias 230.

In addition, the height H of an electronic assembly 33 (including two third electronic components 33a, 33b) with respect to the active face 21a is equal to (or lower than) the height H of the second electronic component 22 with respective to the active face 21a.

Figure 3B:
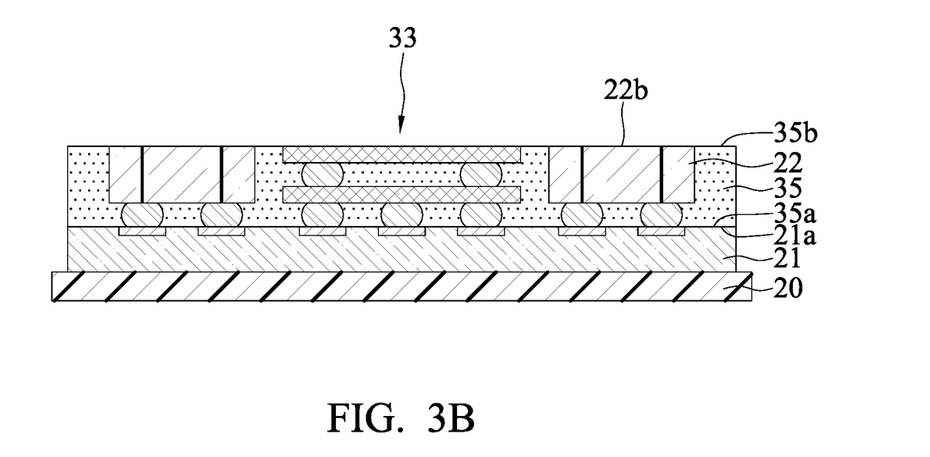

As shown in FIG. 3B, an encapsulating layer 35 is formed on the first electronic component 21, such that the second electronic component 22 and the electronic assembly 33 are encapsulated by the encapsulating layer 35, wherein the encapsulating layer 35 has a first surface 35a and a second surface 35b opposite to each other, and the encapsulating layer 35 is bonded with the active face 21a via the first surface 35a. Then, a planarization process is performed to make the second surface 35b of the encapsulating layer 35 flush with the second side 22b of the second electronic component 22 (or even flush with the top surface of the electronic assembly 33). As such, the second side 22b of the second electronic component 22 (or even the electronic assembly 33) is exposed from the second surface 35b of the encapsulating layer 35.

In an embodiment, the encapsulating layer 35 is an insulating material, such as an encapsulant made of epoxy resin, and can be formed on the first electronic component 21 by lamination or molding.

Moreover, the planarization process includes removing, by polishing, a portion of the encapsulating layer 35, or even a portion of the second side 22b of the second electronic component 22 (or even the electronic assembly 33).

Figure 3C:
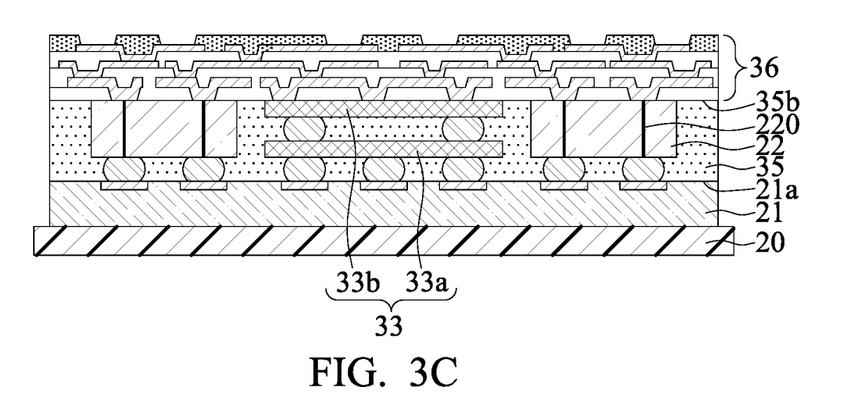

As shown in FIG. 3C, a circuit structure 36 is formed on the second surface 35b of the encapsulating layer 35, so that the circuit structure 36 is electrically connected with the conductive via 220 of the second electronic component 22 (or the electronic assembly 33).

In an embodiment, the circuit structure 36 is further formed on the third electronic components 33a, 33b to be electrically connected with the third electronic component 33b.

Figure 3D:
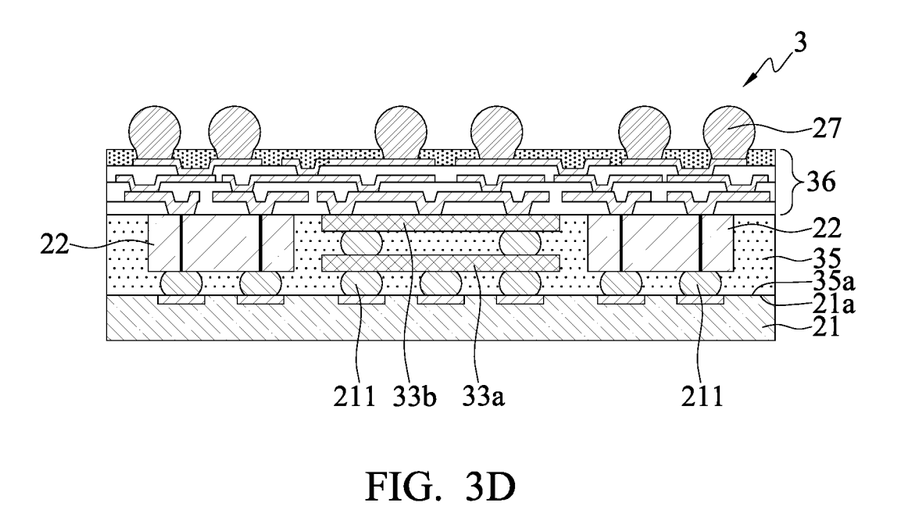

As shown in FIG. 3D, the supporting board 20 is removed, and a plurality of conductive components 27 are formed on the circuit structure 36, such that the conductive components 27 are electrically connected with the circuit structure 36 to allow the electronic package 3 to be connected externally with an electronic device (not shown), such as a circuit board, via the conductive components 27.

Therefore, in the manufacturing method of the present disclosure, the first electronic component 21 is used as the carrier structure, and the passive components made of semiconductor material with fine lines and fine pitches or memory (e.g., the second electronic component 22 or the third electronic components 33a, 33b) can be disposed thereon. As a result, there is no need to dispose the memory in the first electronic component 21, and the first electronic component 21 can be designed as a SoC with a smaller size, thereby improving the product yield.

Moreover, with the design of the conductors 211 of the first electronic component 21, after the passive components made of semiconductor material (e.g., the second electronic component 22 or the third electronic components 33a, 33b) are connected, power supply stability can be improved, while high power can be provided, and better copper migration can be generated under high current.

In addition, passive components required (e.g., the second electronic component 22 or the third electronic components 33a, 33b) can be provided on the first electronic component 21 depending on the needs, so that the number of conductive vias 220 to be laid out can be designed according to the needs. Also, the number of conductive vias 220 in a single passive component can be significantly reduced, thereby facilitating the manufacturing process of the conductive vias 220 and improving the yield of the electronic package 3.

Moreover, the first electronic component 21 is used as the carrier structure on which the required semiconducting passive components (e.g., the second electronic component 22 or the third electronic components 33a, 33b) can be stacked, so there is no need to use a conventional package substrate. Thus, compared to the prior art, the electronic package 3 of the present disclosure is advantageous to miniaturized and thin designs.

The present disclosure further provides an electronic package 2, 3, which includes a first electronic component 21, a second electronic component 22, and third electronic components 23a, 23b, 23c, 33a, 33b.

The first electronic component 21 includes an active face 21a and electrode pads 210 provided on the active face 21a.

The second electronic component 22 is provided on the active face 21a of the first electronic component 21 and includes a first side 22a and a second side 22b opposite to each other and a plurality of conductive vias 220 interconnecting the first side 22a and the second side 22b, such that the second electronic component 22 is connected to the active face 21a via the first side 22a, and the plurality of conductive vias 220 are electrically connected with the electrode pads 210.

The third electronic components 23a, 23b, 23c, 33a, 33b are provided on the active face 21a of the first electronic component 21 and electrically connected to the electrode pads 210.

In an embodiment, the first electronic component 21 is connected to the second electronic component 22 and the third electronic components 23a, 23b, 23c, 33a, 33b via conductors 211.

In an embodiment, a plurality of the third electronic components 23a, 23b, 23c, 33a, 33b are stacked together on the active face 21a of the first electronic component 21.

In an embodiment, a plurality of conductive vias 230 are formed inside the third electronic components 23a, 23b, 23c.

In an embodiment, the first electronic component 21 is an active component.

In an embodiment, the second electronic component 22 and/or the third electronic components 23a, 23b, 23c, 33a, 33b are passive components.

In an embodiment, the electronic package 2, 3 further includes a circuit structure 26, 36 formed on the second side 22b of the second electronic component 22. For example, the circuit structure 36 is further formed on the third electronic components 33a, 33b. Furthermore, the electronic package 2, 3 further includes a plurality of conductive components 27 formed on the circuit structure 26, 36.

In an embodiment, the electronic package 3 further includes an encapsulating layer 35 formed on the active face 21a for encapsulating the second electronic component 22 and the third electronic components 33a, 33b.

In conclusion, in the electronic package and the manufacturing method of the present disclosure, by using the first electronic component as the carrier structure on which passive components made of semiconductor material or memory with fine lines and fine pitches can be disposed, there is no need to dispose the memory in the first electronic component, so the first electronic component can be designed as a SoC with a smaller size, thereby improving the product yield.

Moreover, with the design of the conductors of the first electronic component, after the semiconducting passive components are connected, power supply stability can be improved, and high power can be provided.

In addition, passive components required can be provided on the first electronic component depending on the needs, so that the number of conductive vias to be laid out can be designed according to the needs. Also, the number of conductive vias in a single passive component can be significantly reduced, thereby facilitating the manufacturing process of the conductive vias and improving the yield of the electronic package.

Furthermore, the first electronic component is used as the carrier structure on which the required passive components made of semiconductor material can be stacked, so there is no need to use a conventional package substrate. Thus, compared to the prior art, the electronic package of the present disclosure is advantageous to miniaturized and thin designs.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
   a first electronic component having an active face and electrode pads disposed on the active face;
   a second electronic component provided on the active face of the first electronic component and having a first side and a second side opposite to each other and a plurality of conductive vias interconnecting the first side and the second side, wherein the second electronic component is connected to the active face via the first side, and the plurality of conductive vias are electrically connected with the electrode pads; and
   a third electronic component provided on the active face of the first electronic component and electrically connected to the electrode pads.

2. The electronic package of claim 1, wherein the first electronic component is connected to the second electronic component and the third electronic component via conductors.

3. The electronic package of claim 1, wherein a plurality of the third electronic components are stacked on top of another one on the active face of the first electronic component.

4. The electronic package of claim 1, further comprising a plurality of another conductive vias formed inside the third electronic component.

5. The electronic package of claim 1, wherein the first electronic component is an active component.

6. The electronic package of claim 1, wherein at least one of the second electronic component and the third electronic component is a passive component.

7. The electronic package of claim 1, further comprising a circuit structure formed on the second side of the second electronic component.

8. The electronic package of claim 7, wherein the circuit structure is further formed on the third electronic component.

9. The electronic package of claim 7, further comprising a plurality of conductive components formed on the circuit structure.

10. The electronic package of claim 1, further comprising an encapsulating layer formed on the active face for encapsulating the second electronic component and the third electronic component.

11. A method of manufacturing an electronic package, comprising:
    providing a first electronic component having an active face and electrode pads disposed on the active face;
    providing a second electronic component on the active face of the first electronic component, wherein the second electronic component has a first side and a second side opposite to each other and a plurality of conductive vias interconnecting the first side and the second side, such that the second electronic component is connected to the active face via the first side, and the plurality of conductive vias are electrically connected with the electrode pads; and
    providing a third electronic component on the active face of the first electronic component and electrically connected to the electrode pads.

12. The method of claim 11, wherein the first electronic component is connected to the second electronic component and the third electronic component via conductors.

13. The method of claim 11, wherein a plurality of the third electronic components are stacked on top of another one on the active face of the first electronic component.

14. The method of claim 11, further comprising forming a plurality of another conductive vias inside the third electronic component.

15. The method of claim 11, wherein the first electronic component is an active component.

16. The method of claim 11, wherein at least one of the second electronic component and the third electronic component is a passive component.

17. The method of claim 11, further comprising forming a circuit structure on the second side of the second electronic component.

18. The method of claim 17, wherein the circuit structure is further formed on the third electronic component.

19. The method of claim 17, further comprising forming a plurality of conductive components on the circuit structure.

20. The method of claim 11, further comprising forming an encapsulating layer on the active face for encapsulating the second electronic component and the third electronic component.

* * * * *